(12) United States Patent
Kirchhoff

(10) Patent No.: US 6,713,364 B2
(45) Date of Patent: Mar. 30, 2004

(54) METHOD FOR FORMING AN INSULATOR HAVING A LOW DIELECTRIC CONSTANT ON A SEMICONDUCTOR SUBSTRATE

(75) Inventor: Markus Kirchhoff, Ottendorf-Okrilla (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 09/918,428

(22) Filed: Jul. 27, 2001

(65) Prior Publication Data

US 2002/0022339 A1 Feb. 21, 2002

(30) Foreign Application Priority Data

Jul. 27, 2000 (DE) ......................................... 100 36 725

(51) Int. Cl.$^7$ ............................................. H01L 21/76
(52) U.S. Cl. ................... 438/409; 438/476; 438/594; 438/623; 438/758; 438/769; 438/770; 438/778; 438/787; 438/789; 438/790
(58) Field of Search ...................... 438/770, 769, 438/787, 789, 790, 409, 778, 623, 476, 758, 773, 594, 774, 788

(56) References Cited

U.S. PATENT DOCUMENTS

| | | | |
|---|---|---|---|
| 5,472,913 A | 12/1995 | Havemann et al. | 437/195 |
| 5,548,159 A | 8/1996 | Jeng | 257/634 |
| 5,935,410 A | 8/1999 | Thönissen et al. | 205/655 |
| 6,066,573 A | 5/2000 | Muroyama | 438/778 |
| 6,194,305 B1 * | 2/2001 | Iyer | 438/622 |
| 6,251,470 B1 * | 6/2001 | Forbes et al. | 427/97 |
| 6,277,765 B1 * | 8/2001 | Cheng et al. | 438/773 |

FOREIGN PATENT DOCUMENTS

| | | | |
|---|---|---|---|
| JP | 55044719 | | 3/1980 |
| JP | 58107645 A | | 6/1983 |
| JP | 63019838 | | 1/1988 |
| JP | 63221637 A | | 9/1988 |
| JP | 04010419 | | 1/1992 |
| JP | 10092804 A | | 4/1998 |
| JP | 11186258 A | | 7/1999 |
| JP | 00012690 A | | 1/2000 |

OTHER PUBLICATIONS

Van Zant, Peter, Microchip Fabrication, 4$^{th}$ ed., McGraw–Hill, pp. 386–388.*
Wolf and Tauber, Silicon Processing for the VSLI era, pp. 177–179.*
Bhattacharya et al.: "Study of Photoluminiscence in Porous Silicon Prepared by Electrochemical Etching of Amorphous Silicon" Physics of Semiconductor devices, 1998, pp. 603–606.
Solomon et al.: "Spatial and quantum confinement in crystalline and amorphous porous silicon" Journal of Non–Crystalline Solids (1998), pp. 248–253.
Imai et al. "FIPOS (Full Isolation by Porous Oxidized Silicon) Technology and Its Application to LSI's", IEEE Transactions on Electron Devices, 1984, vol. 31, No. 3, pp. 297–302.

* cited by examiner

Primary Examiner—Michael S. Lebentritt
Assistant Examiner—Michael K. Luhrs
(74) Attorney, Agent, or Firm—Laurence A. Greenberg; Werner H. Stemer; Gregory L. Mayback

(57) ABSTRACT

A method for fabricating an insulator on a semiconductor substrate such that the insulator has a low dielectric constant. A first interconnect and a second interconnect are configured on a semiconductor substrate. A conductive silicon is formed between the first interconnect and the second interconnect. The conductive silicon is anodically etched in a hydrofluoric-acid-containing electrolyte to convert the conductive silicon into porous silicon. The porous silicon is subsequently oxidized to form porous silicon oxide. With a dielectric constant of between 1.1 and 4, the porous silicon oxide has a lower dielectric constant than customary silicon oxide with 4.

4 Claims, 1 Drawing Sheet

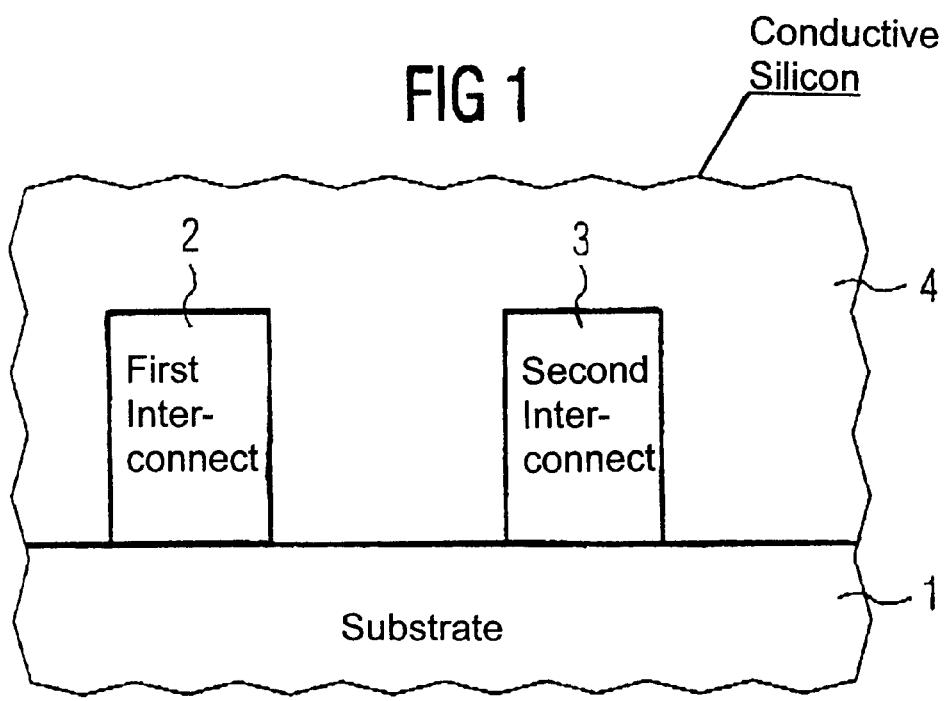
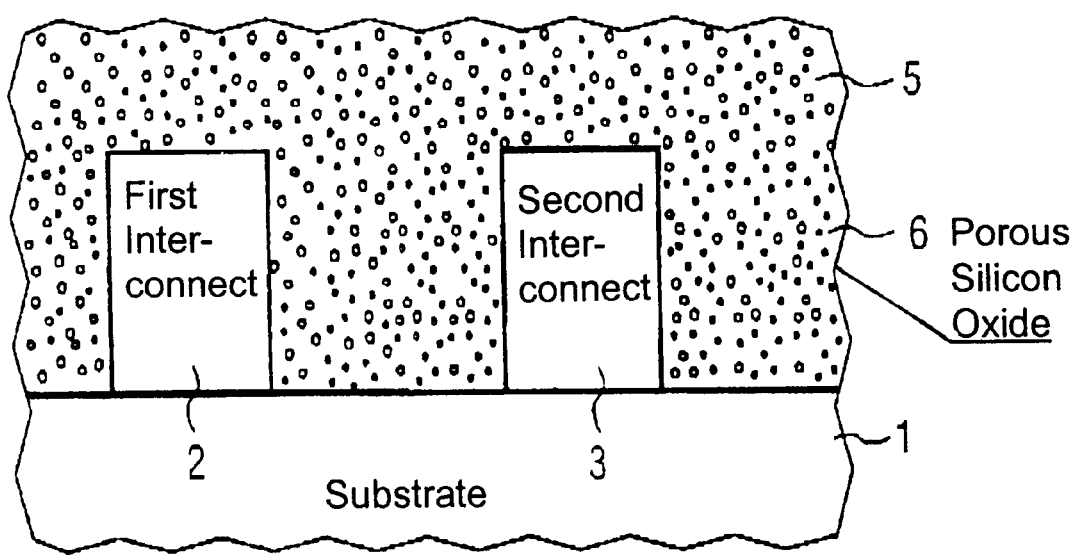

METHOD FOR FORMING AN INSULATOR HAVING A LOW DIELECTRIC CONSTANT ON A SEMICONDUCTOR SUBSTRATE

BACKGROUND OF THE INVENTION

Field of the Invention

The present invention relates to a method for fabricating an insulator having a low dielectric constant in which the insulator is located between interconnects on a semiconductor substrate.

Electronic circuits that are connected to one another with electrical wiring are usually configured in semiconductor substrates. To that end, the electrical wiring is insulated from the semiconductor substrate by an insulating layer and the electronic components in the semiconductor substrate are connected to the metal wiring by so-called vias (contact holes). Since the electrical wiring has a row of interconnects which are formed relatively close together on the insulating layer, there is capacitive coupling between adjacent interconnects. The capacitive coupling between adjacent interconnects becomes greater, as the dielectric constant of the material located between the interconnects becomes higher. In this case, a large coupling capacitance has the disadvantage that electrical signals on the interconnects are delayed and attenuated by the high capacitance.

Undoped or doped silicon oxide, silicon nitride or silicon oxynitride layers are usually used as dielectric layers between interconnects on a semiconductor chip. These layers have dielectric constants of between 4 and 7. The increasing miniaturization of the structures has the effect that the distance between two interconnects keeps on decreasing. As a result, the coupling capacitance between adjacent interconnects keeps on increasing. In this case, the extent of capacitive coupling is directly proportional to the dielectric constant of the insulating material configured between two interconnects. Known insulators having a dielectric constant of less than 4 are e.g. fluorine-doped oxides and organic materials. However, these materials have integration problems during interaction with customary semiconductor fabrication processes such as RIE (reactive ion etching), CMP (chemical mechanical polishing) and thermal processes, since organic materials are, for example, too unstable for these fabrication methods.

SUMMARY OF THE INVENTION

It is accordingly an object of the invention to provide a method for fabricating an insulator, between interconnects on a semiconductor substrate, which overcomes the above-mentioned disadvantageous of the prior art methods of this general type. In particular, it is an object of the invention to provide such a method to fabricate the insulator with a relatively low dielectric constant.

With the foregoing and other objects in view there is provided, in accordance with the invention a method for fabricating an insulator on a semiconductor substrate. The method includes steps of: providing a semiconductor substrate having a first interconnect and a second interconnect; forming amorphous silicon between the first interconnect and the second interconnect; anodically etching the amorphous silicon in a hydrofluoric-acid-containing electrolyte to convert the amorphous silicon into a porous silicon; and oxidizing the porous silicon to convert the porous silicon into a porous silicon oxide.

The advantage of the method is that well-known materials exhibiting good compatibility, such as silicon and silicon oxide, are used during the fabrication of the dielectric. A silicon oxide usually has a dielectric constant of 4, which can be reduced to values of between 1.1 and 4 through the formation of a porous silicon oxide. In this case, silicon oxide and porous silicon oxide are compatible with process steps such as RIE, CMP and thermal processes. Therefore, porous silicon oxide is outstandingly suitable for forming an intermetal dielectric.

By way of example, the formation of porous silicon is shown in "Spatial and quantum confinement in crystalline and amorphous porous silicon", I. Solomon et al., Journal of Non-Crystalline Solids 227–230 (1998) 248–253, U.S. Pat. No. 5,935,410, and "Study of Photoluminescence in Porous Silicon Prepared by Electrochemical Etching of Amorphous silicon", E. Bhattacharya et al., Physics of Semiconductor Devices, 603–606 (1998).

In accordance with an added feature of the invention, the conductive silicon is an amorphous silicon, a microcrystalline silicon, or a polysilicon. The aforementioned silicon structures are suitable for being converted into a porous silicon using a hydrofluoric-acid-containing electrolyte in an anodic etching process. In this case, porous silicon, involving a nanostructured material, is produced within a specific process regime. In this case, the degree of porosity can be varied between 20 and 90% by way of the process parameters. In this case, the porous silicon has a distinctly lower conductivity than the compact silicon from which it is formed.

In accordance with an additional feature of the invention, the conductive silicon is deposited on the substrate by an LPCVD (low pressure chemical vapor deposition) method, a PECVD (plasma enchanced chemical vapor deposition) method, or an RTCVD (rapid thermal chemical vapor deposition) method. The advantage of the aforementioned deposition methods is that the conductive silicon is deposited conformally on interconnects configured on the substrate surface. Furthermore, the aforementioned methods are suitable for filling interspaces between interconnects in a manner free from shrink holes. This has the advantage that fewer gas inclusions are formed in the dielectric layer.

In accordance with a concomitant feature of the invention, the oxidation of the porous silicon is carried out using an RTP (rapid thermal process) step, a furnace step, a plasma treatment or an anodic oxidation with the aid of oxygen. The aforementioned oxidation methods are advantageously suitable for forming a porous silicon oxide from the porous silicon.

Other features which are considered as characteristic for the invention are set forth in the appended claims.

Although the invention is illustrated and described herein as embodied in a method for forming an insulator having a low dielectric constant on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a substrate with interconnects and a conductive silicon;

FIG. 2 shows the substrate with the interconnects shown in FIG. 1, in which the conductive silicon has been converted into a porous silicon and then into a porous silicon oxide.

DESCRIPTION OF THE PREFERRED EMBODIMENTS

Referring now to the figures of the drawing in detail and first, particularly, to FIG. 1 thereof, there is shown a substrate 1 on which a first interconnect 2 and a second interconnect 3 are configured. Using a suitable deposition method, such as, for example, an LPCVD, PECVD, or RTCVD method, conductive silicon 4 is configured on the substrate 1, the first interconnect 2, and the second interconnect 3, and between the first interconnect 2 and the second interconnect 3. In this case, the conductive silicon may be formed for example as amorphous silicon, polysilicon or microcrystalline silicon. By way of example, an amorphous silicon can be converted into a microcrystalline or polycrystalline silicon by means of a thermal step.

With reference to FIG. 2, an anodic etching step is carried out using a hydrofluoric-acid-containing electrolyte, the conductive silicon 4 being converted into porous silicon 5. In a subsequent oxidation step, the porous silicon 5 is converted into a porous silicon oxide 6. By way of example, an RTP step, a furnace step, a plasma treatment or an anodic oxidation is suitable for the oxidation. By way of example, electrolytes which do not contain hydrofluoric acid are suitable for the anodic oxidation.

The oxidation is advantageously carried out using oxygen.

What is advantageous about using an amorphous silicon layer 4 is the conformity of a deposited amorphous silicon layer 4 and the structure of the porous layer which is formed therefrom by means of anodic oxidation and which is converted, by oxidation, into a particularly advantageous insulator having a low dielectric constant. Advantage is attached to the uniformity and stable structure of the porous amorphous layer, whose number of pores can be made significantly larger than that of other deposited silicon layers and whose pore diameter can be made smaller, thereby enabling a higher integration density with smaller spacings between adjacent interconnects.

I claim:

1. A method for fabricating an insulator on a semiconductor substrate, which comprises:

providing a semiconductor substrate having a first interconnect and a second interconnect;

forming amorphous silicon between the first interconnect and the second interconnect;

anodically etching the amorphous silicon in a hydrofluoric-acid-containing electrolyte to convert the amorphous silicon into a porous silicon; and anodically oxidizing the porous silicon using an electrolyte that does not contain hydrofluoric acid to convert the porous silicon into a porous silicon oxide.

2. The method according to claim 1, which comprises performing the step of forming the amorphous silicon such that the amorphous silicon is conductive.

3. The method according to claim 2, which comprises performing the step of forming the amorphous silicon by depositing the amorphous silicon on the semiconductor substrate using a method selected from the group consisting of an LPCVD method, an PECVD method, and an RTCVD method.

4. The method according to claim 1, which comprises performing the step of forming the amorphous silicon by depositing the amorphous silicon on the semiconductor substrate using a method selected from the group consisting of an LPCVD method, an PECVD method, and an RTCVD method.

* * * * *